United States Patent [19]

Murphy

[11] Patent Number: 4,495,458
[45] Date of Patent: Jan. 22, 1985

[54] TERMINATION FOR HIGH IMPEDANCE ATTENUATOR

[75] Inventor: Desmond L. Murphy, Portland, Oreg.

[73] Assignee: Tektronix, Beaverton, Oreg.

[21] Appl. No.: 431,852

[22] Filed: Sep. 30, 1982

[51] Int. Cl.³ ............................................. G01R 27/00
[52] U.S. Cl. .................................. 324/57 R; 324/58 B
[58] Field of Search ............................ 324/57 R, 58 B

[56] References Cited

U.S. PATENT DOCUMENTS

| | | | |
|---|---|---|---|
| 3,244,978 | 4/1966 | Craven et al. | 324/58 B |
| 3,249,863 | 5/1966 | Wright | 324/57 R |
| 3,381,218 | 4/1968 | Taylor | 324/57 R |
| 3,704,409 | 11/1972 | Oomen | 324/58 B |
| 3,800,218 | 3/1974 | Shekel | 324/57 R |

Primary Examiner—Stanley T. Krawczewicz
Attorney, Agent, or Firm—George T. Noe

[57] ABSTRACT

A termination for high impedance attenuator to be connected to the input of such high impedance attenuator. The termination circuit includes a series combination of a termination resistor, a delay line and an inductor, thereby cancelling the negative reflection due to the capacitive element at the output of the attenuator while maintaining the overall input impedance constant over a wide frequency range.

10 Claims, 6 Drawing Figures

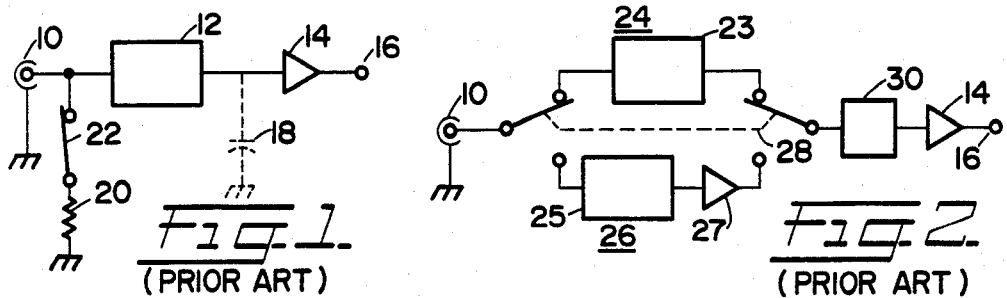
Fig. 1. (PRIOR ART)
Fig. 2. (PRIOR ART)
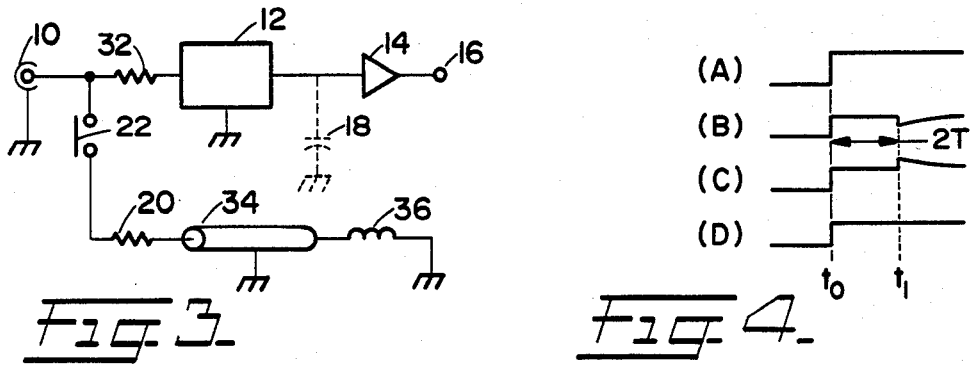
Fig. 3.
Fig. 4.
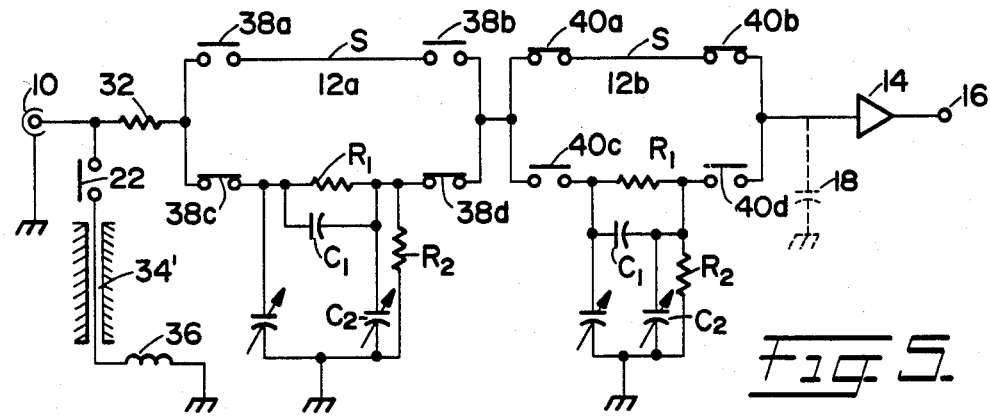
Fig. 5.
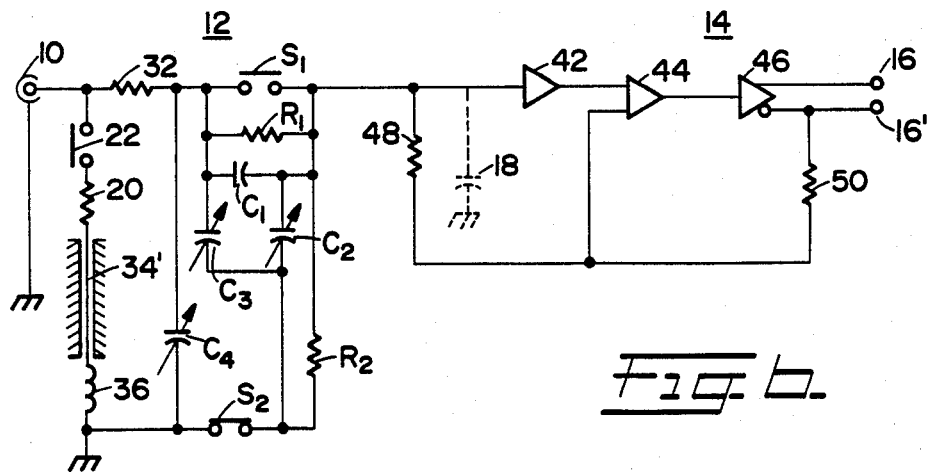
Fig. 6.

TERMINATION FOR HIGH IMPEDANCE ATTENUATOR

BACKGROUND OF THE INVENTION

This invention relates generally to a termination for high impedance attenuator, and more specifically, to an oscilloscope input circuit including a switchable high impedance attenuator section and an input terminator of such attenuator section.

General purpose electronic test and measurement instruments such as, for example, oscilloscopes are normally designed to include as part of the input circuit thereof switchable attenuators to accept a wide range of input signal voltages. Such attenuators preferably have high input resistance such as 1MΩ, thereby reducing the loading effect upon the signal source to be measured. Such input circuits exhibit high inherent capacitance (C) which, in combination with the high input resistance (R) of attenuators, forms an RC network which limits the bandwidth, thereby rendering the instrument unsuitable for measuring the terminated end of a wideband transmission line of typically 50Ω characteristic impedance ($Z_0$).

One conventional approach to correct this problem is to utilize a switchable low impedance (e.g. 50Ω) terminator at the input side of such attenuators as shown in FIG. 1. An input signal applied to input connector 10 is attenuated to a proper amplitude by switchable 1MΩ attenuator 12 before being applied to buffer amplifier 14 including inherent input capcitance 18. The output from buffer amplifier 14 is further amplified by amplifiers connected to output terminal 16. Attenuator 12 may be a high frequency type fabricated on a ceramic substrate by thick film technique as disclosed in U.S. Pat. No. 3,753,170, assigned to the assignee of the present invention. A series combination of switch 22 and termination resistor 20 is connected between the input end of attenuator 12 and ground. Switch 22 is normally open to reduce the loading effect but is closed when measuring terminated ends or low impedance wideband signal sources.

Another conventional approach is shown in FIG. 2, which utilizes a switchable low impedance input attenuator section 24 and high impedance input attenuator section 26 comprising high impedance attenuator 25 and impedance converter 27. The input signal applied to input terminal 10 is transmitted to low impedance common attenuator section 30 either through input attenuator section 24 or 26 depending on selection switch 28 before reaching terminal 16 via buffer amplifier 14. Attenuator sections 23, 25 and 30 are typically ganged together to allow single knob control.

Disadvantages of these prior arts are large reflections and complicated mechanical/electrical construction. That is, attenuator 12 is fabricated along a transmission line of a uniform characteristic impedance. When a step pulse A as shown in FIG. 4 is applied to input terminal 10, such pulse is reflected to provide a negative reflection as represented by waveform B in FIG. 4 because of inherent capacitance 18. The time T represents the delay time of the transmission line of such attenuator 12. This causes an adverse effect on the signal source.

SUMMARY OF THE INVENTION

In order to reduce the signal reflection at the input circuit of a high resistance attenuator section while maintaining as simple as circuit arrangement as possible, the present invention intentionally develops a positive reflection for effective cancellation of the aforementioned negative reflection, thereby minimizing the loading effect to a terminated end or any other high frequency signal source to which the high impedance attenuator is connected. The negative and positive reflections are carefully adjusted to achieve a high degree of cancellation. It should be noted, however, that the termination impedance remains constant over the wide frequency range despite the addition of such positive reflection.

It is therefore an object of this invention to provide an improved termination for high impedance attenuator with minimum loading effect.

It is another object of this invention to provide a selectable impedance input circuit for a test and measurement instrument such as, for example, an oscilloscope, a logic analyzer, etc.

BRIEF DESCRIPTION OF THE DRAWINGS

Various features and advantages of the present invention will become more apparent upon consideration of the following description taken in conjunction with the accompanying drawings wherein:

FIGS. 1 and 2 are exemplary prior art attenuators;

FIG. 3 is a simplified schematic illustrating the principle of this invention;

FIG. 4 shows a series of waveforms to explain the termination for the high impedance attenuator shown in FIG. 3;

FIG. 5 is a more detailed circuit of one preferred embodiment of this invention; and FIG. 6 is a circuit schematic of another preferred embodiment of this invention.

DETAILED DESCRIPTION OF THE PREFERRED EMBODIMENT

As is understood by comparing FIGS. 1 and 3, the present invention differs from the prior art by the addition of damping resistor 32 in series with attenuator 12 at the input side thereof, and a series combination of delay line 34 and inductor 36 connected between termination resistor 20 and ground. Preferably, both resistors 20 and 32 have equal resistance, e.g. 50Ω. This small resistor 32 causes essentially no effect on the attenuator performance when switch 22 is open because the resistance is negligible in comparison with the input resistance (e.g. 1MΩ) of high impedance (resistance) attenuator 12. Therefore, the circuit may operate as a conventional high impedance attenuator for lower frequency applications.

In the low impedance or terminated mode of operation when termination switch 22 is closed, the two signal paths including damping resistor 32 and termination resistor 20 are connected in parallel to input connector 10. For high frequency signal components, attenuator 12 is considered as a low impedance transmission line with delay time T. Assuming that the characteristic impedance $Z_o$ of each attenuator 12 and delay line 32 is 50Ω, the combined impedance to the signal applied to input connector 10 at the time $t_0$ in FIG. 4 is 50Ω because each signal path includes a serial connection of 50Ω resistor (32, 20) and 50Ω transmission line (12, 34). The input signal is, therefore, split into two equal parts in the two signal paths. When the signal reaches the output ends of such transmission lines, a negative reflection is caused by capacitor 18 at the output of attenuator 12 and travels back to input connector 10 through attenuator 12 and damping resistor 32. The damping resistor 32 attenuates such reflection. The reflection by capacitance 18 may appear as represented by waveform B shown in FIG. 4 when observed by using a TDR (Time Domain Reflectometer). Similarly, the signal at the output of delay line 34 of delay time T is reflected positively in this signal path because of high impedance (L) of inductor 36. The positive reflection is transmitted back to input connector 10 through delay line 34 and termination resistor 20 with equal attenuation to that in the first signal path. The TDR display of the positive reflection may appear as represented by waveform C shown in FIG. 4. Both positive and negative reflections take 2T time to reach the input after application of the step pulse A. The net result is represented by waveform D shown in FIG. 4 and is understood to have no reflection at time $t_1$.

It should be noted that termination resistor 20 alone determines the input termination resistance at DC and low frequencies. The impedance of the second signal path including termination resistor 20 increases as the signal frequency increases. However, that of the first signal path including attenuator 12 decreases, thereby maintaining the input impedance substantially equal to 50Ω over the wide frequency range.

The proper inductance of inductor 36 is found by setting the product of the impedance $Z_C$ of capacitor 18 and the impedance $Z_L$ of inductor 36 equal to the square of the characteristic impedance $Z_O$. That is, $$Z_L Z_C = j\omega L/j\omega C = L/C = Z_O^2$$

hence, $$L = Z_O^2 C.$$

Referring to FIG. 5 illustrating one preferred embodiment of this invention, the delay line 34 is represented by a so-called strip line 34' of the predetermined length to provide the required signal delay. Attenuator 12 consists, in this particular embodiment, of two switchable stages 12a and 12b connected in cascade manner. Of course, more than two attenuator stages of different attenuation factors may be connected to provide more attenuation factors. Each attenuator stage includes two pairs of ganged switches 38a–38d and 40a–40d and a high impedance RC attenuator including at least a serial resistor $R_1$, a shunt resistor $R_2$ and capacitors $C_1$, $C_2$ paralleled by resistors $R_1$ and $R_2$. High impedance attenuators are well known to those skilled in the art and thus will not be described in detail herein. Each attenuator stage 12a, 12b provides a given attenuation depending upon the setting of switches 38 and 40. On closing switches 38a–38b or 40a–40b, the respective attenuator is bypassed through shunt signal path S which is a strip line configuration, thereby transmitting the signal with no attenuation. On closing switches 38c–38d or 40c–40d, the respective attenuator is inserted to provide the predetermined attenuation of the signal. Strip line 34' may have essentially the same length as the sum of the transmission line of the attenuators 12a and 12b.

Assuming that capacitance 18 is 1.5 pF and the characteristic impedance $Z_o$ is 50Ω, the proper inductance L of inductor 36 may be:

$$L = Z_O^2 C = 2500 \times 1.5 \times 10^{-12} = 3.75 \times 10^{-9} = 3.75 \text{ nH}$$

Referring now to FIG. 6 illustrating another embodiment of this invention, the circuit arrangement is similar to that of FIG. 5 except for the details of attenuator 12 and buffer amplifier 14. Attenuator 12 consists of only one switchable attenuation stage including ganged switches $S_1$, $S_2$, serial resistor $R_1$, shunt resistor $R_2$, and four capacitors $C_1$–$C_4$. The signal is not attenuated when $S_1$ is on and $S_2$ is off, but attenuated by the predetermined factor when $S_1$ is off and $S_2$ is on. More than one switchable attenuator stages may be connected in cascade manner.

Buffer amplifier stage 14 is somewhat different from any conventional design and consists of AC amplifier 42 including low capacitance coupling capacitor at the input side, summing amplifier 44 and output impedance converter stage 46 which may provide two output signals of opposite polarity. The input signal to AC amplifier 42 and the inverting output of output amplifier 46 is coupled to the input of summing amplifier 44 through substantially equal resistors 48 and 50. The junction voltage of the two resistors 48 and 50 remains zero as long as the output signal on output terminal 16' precisely follows the input signal but in opposite polarity. In other words, any error in DC and low frequency components between the input and the output signals is amplified by summing amplifier 44 and output amplifier 46. AC amplifier 42 may be a source follower FET amplifier including a common base transistor connected to the source of the FET. Summing amplifier 44 may be an operational amplifier to provide the output thereof to the emitter of the common base transistor. Output amplifier 46 may be an emitter follower transistor including a common base transistor amplifier connected to the collector of the emitter follower transistor. Non-inverted output 16 may be connected to the emitter of the emitter follower transistor while the inverted output 16' may be connected to the collector of the common base transistor.

It may be observed in the foregoing description that the termination for high impedance attenuator according to this invention provides the ideal termination over the wide frequency range without any measurable signal reflection that may cause adverse effect such as signal aberrations known as glitches to the signal source. The circuit construction is very simple and compatible with any existing circuit. The proper delay line and inductance needed for a high degree cancellation are physically determined for particular circuit, thereby eliminating the need for adjustment or recalibration.

It will therefore be appreciated that the aforementioned and other desirable objects have been achieved; however, it should be noted that the particular embodiments of the invention which are shown and described herein are intended as merely illustrative and not restrictive of the invention.

What I claim as novel is:

1. A termination for high impedance attenuator, comprising:
    an input terminal;
    a first signal path including a high impedance attenuator, a buffer amplifier connected in cascade to said attenuator and a first resistor for coupling said input terminal to the input of said attenuator; and
    a second signal path including a series connection of a second resistor, a delay line and an inductor connected between said input terminal and a reference potential source.

2. A termination for high impedance attenuator in accordance with claim 1 wherein said first and second resistors have equal resistance and the characteristic impedance and delay time of said attenuator and said delay line are equal to each other.

3. A termination for high impedance attenuator in accordance with claim 1 wherein said second signal path further includes a switch for selectively connecting the second signal path to said input terminal.

4. A termination for high impedance attenuator according to claim 2 wherein the resistance and characteristic impedance of said first and second resistors, said attenuator and said delay line are chosen to be 50 ohms.

5. A termination for high impedance attenuator in accordance with claim 1 wherein said delay line is a strip line.

6. In an input circuit for a wideband electrical measurement instrument including a switchable high impedance attenuator and an input attenuator having an inherent input capacitance, the input circuit further comprising:
   a damping resistor connected between an input terminal and the input of said attenuator; and
   a series circuit comprising a switch, a termination resistor, a delay line and an inductance connected between said input terminal and a reference potential source.

7. In an input circuit for a wideband electrical measurement instrument in accordance with claim 6 wherein said attenuator is a switchable one megohm attenuator and said termination resistor is 50 ohms.

8. In an input circuit for a wideband electrical measurement instrument in accordance with claim 6 wherein said input amplifier includes an AC amplifier, a summing amplifier and an output amplifier connected in cascade, and the input to said AC amplifier and the inverting output of said output amplifier are applied to said summing amplifier each through a coupling resistor.

9. A termination circuit for a transmission line connected to a capacitive load, comprising:
   a damping resistor connected in series with the input of said transmission line; and
   a series combination of a termination resistor, a delay line and an inductor connected between the input end of said damping resistor and ground.

10. A termination circuit in accordance with claim 9 wherein said transmission line and said delay line have equal characteristic impedance and delay time to each other and said damping and termination resistors have the same resistance as said characteristic impedance.

* * * * *